(12) United States Patent
Xie et al.

(10) Patent No.: US 9,263,446 B1
(45) Date of Patent: Feb. 16, 2016

(54) METHODS OF FORMING REPLACEMENT GATE STRUCTURES ON TRANSISTOR DEVICES WITH A SHARED GATE STRUCTURE AND THE RESULTING PRODUCTS

(71) Applicant: GLOBALFOUNDRIES Inc., Grand Cayman (KY)

(72) Inventors: Ruilong Xie, Niskayuna, NY (US); Kwan-Yong Lim, Niskayuna, NY (US); Min Gyu Sung, Latham, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/511,286

(22) Filed: Oct. 10, 2014

(51) Int. Cl.
*H01L 21/8238* (2006.01)
*H01L 27/092* (2006.01)
*H01L 29/06* (2006.01)
*H01L 29/66* (2006.01)
*H01L 21/3213* (2006.01)
*H01L 21/28* (2006.01)

(52) U.S. Cl.
CPC ...... *H01L 27/0922* (2013.01); *H01L 21/28088* (2013.01); *H01L 21/32133* (2013.01); *H01L 21/32139* (2013.01); *H01L 21/823842* (2013.01); *H01L 29/0649* (2013.01); *H01L 29/6653* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| 8,716,120 | B2* | 5/2014 | Hempel | H01L 21/823842 257/368 |
| 2010/0237424 | A1* | 9/2010 | Cheng | H01L 21/823828 257/369 |
| 2013/0241003 | A1* | 9/2013 | Lin | H01L 21/823431 257/392 |

* cited by examiner

*Primary Examiner* — Michael Lebentritt
*Assistant Examiner* — Jordan Klein
(74) *Attorney, Agent, or Firm* — Amerson Law Firm, PLLC

(57) ABSTRACT

One illustrative method disclosed herein includes, among other things, forming a shared gate cavity that spans across an isolation region and is positioned above first and second active regions, forming at least one layer of material in the shared gate cavity above the first and second active regions and above the isolation region, forming a first masking layer that covers portions of the shared gate cavity positioned above the first and second active regions while exposing a portion of the shared gate cavity positioned above the isolation region, with the first masking layer in position, performing at least one first etching process to remove at least a portion of the at least one layer of material in the exposed portion of the shared gate cavity above the isolation region, and removing the first masking layer.

20 Claims, 10 Drawing Sheets

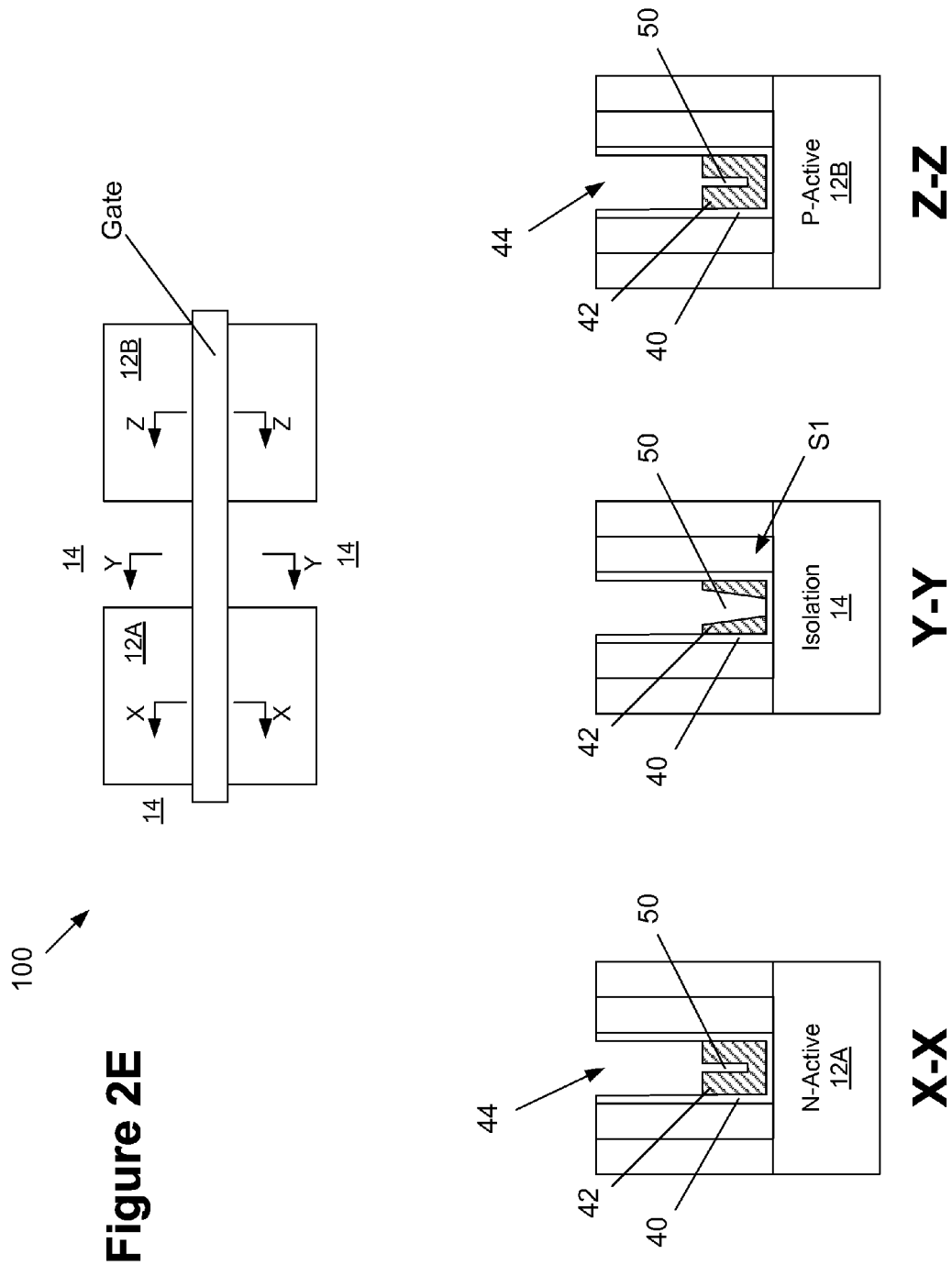

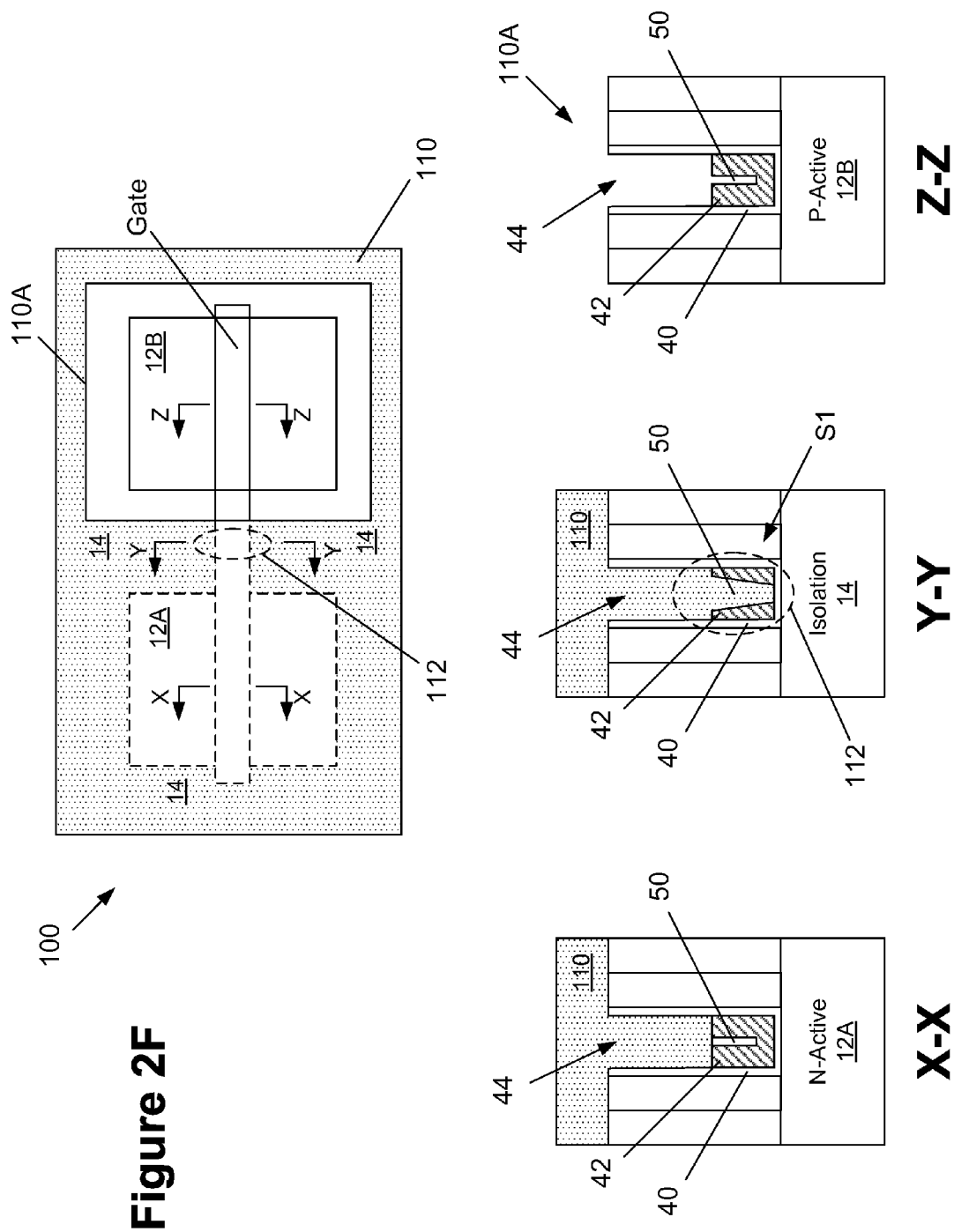

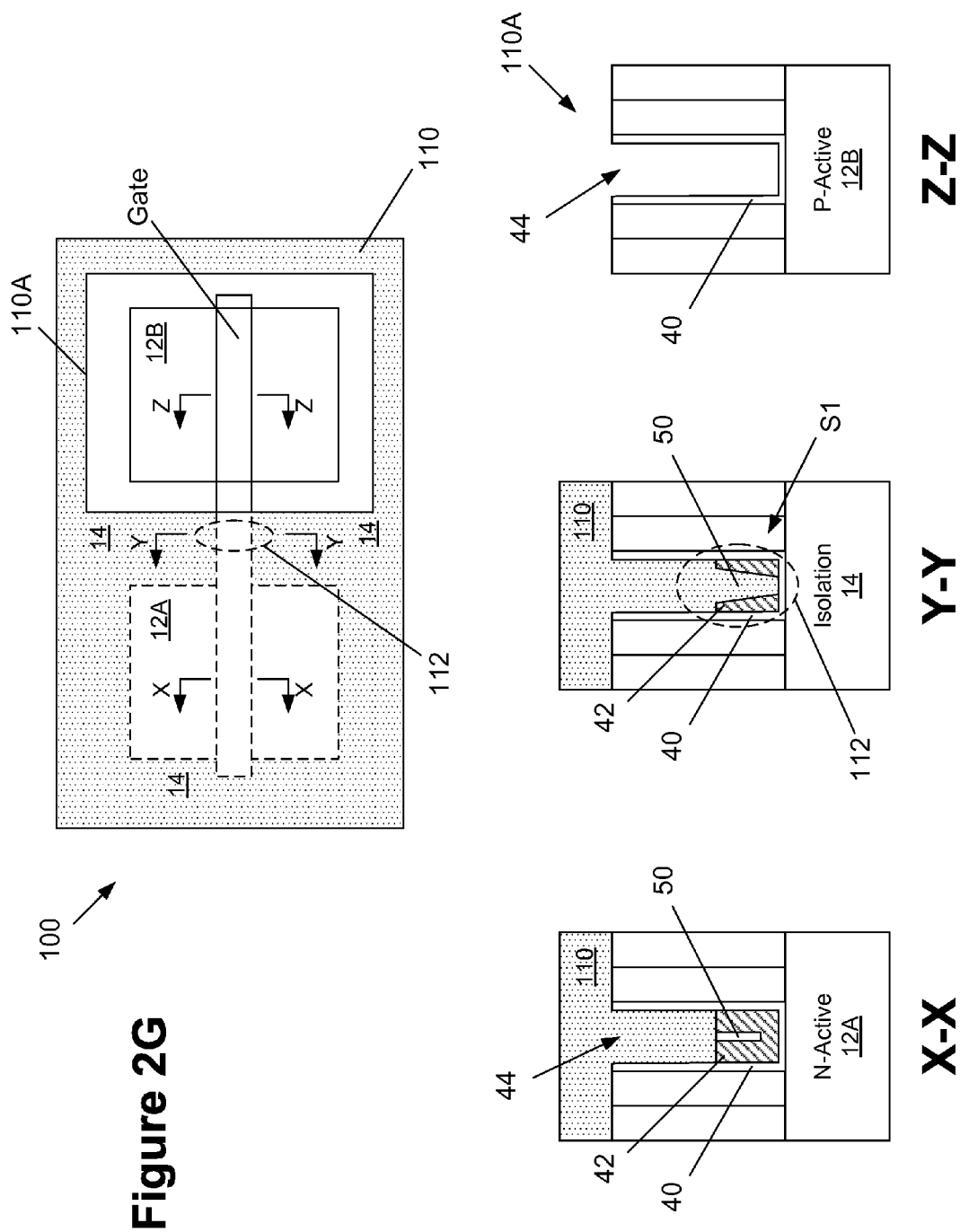

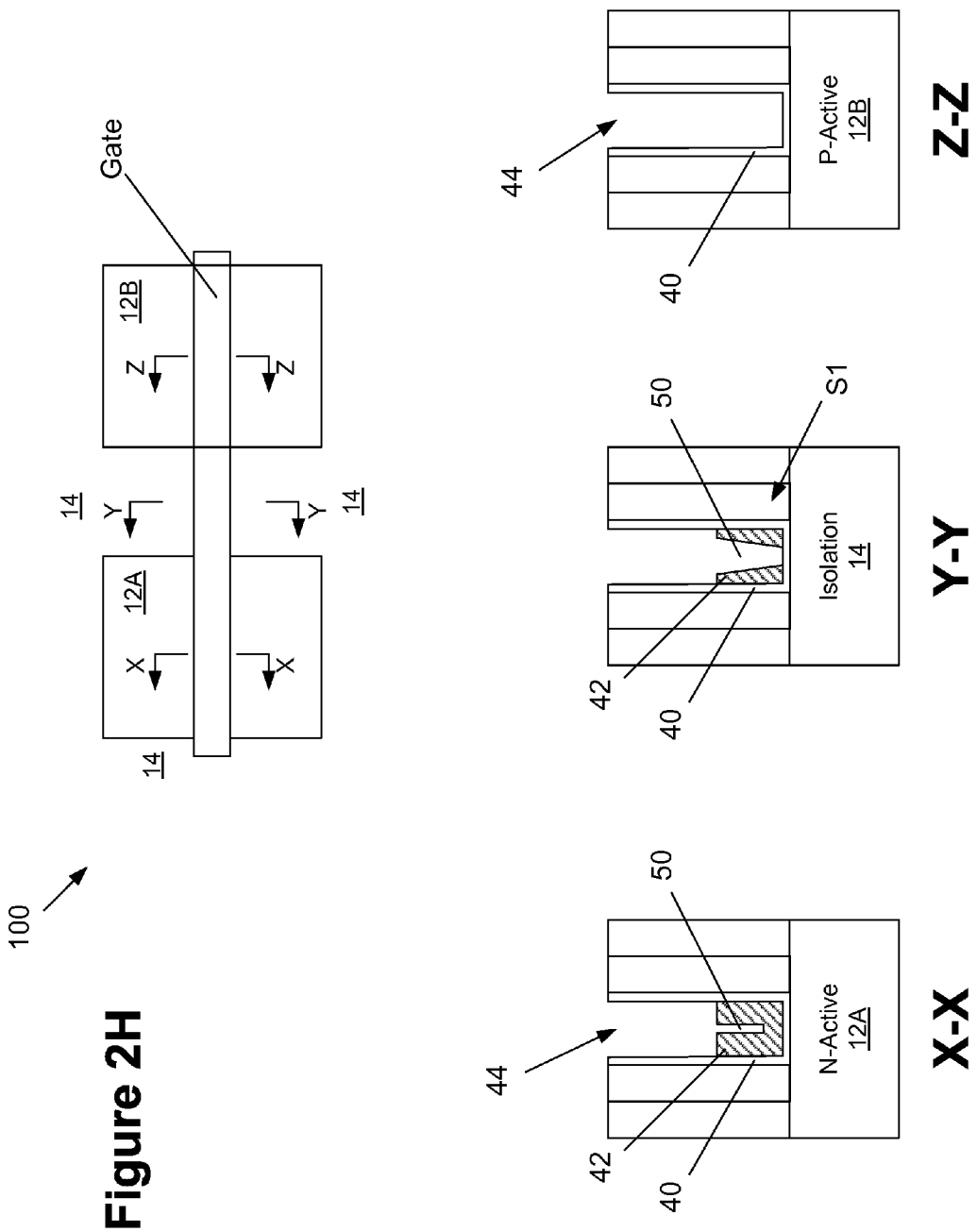

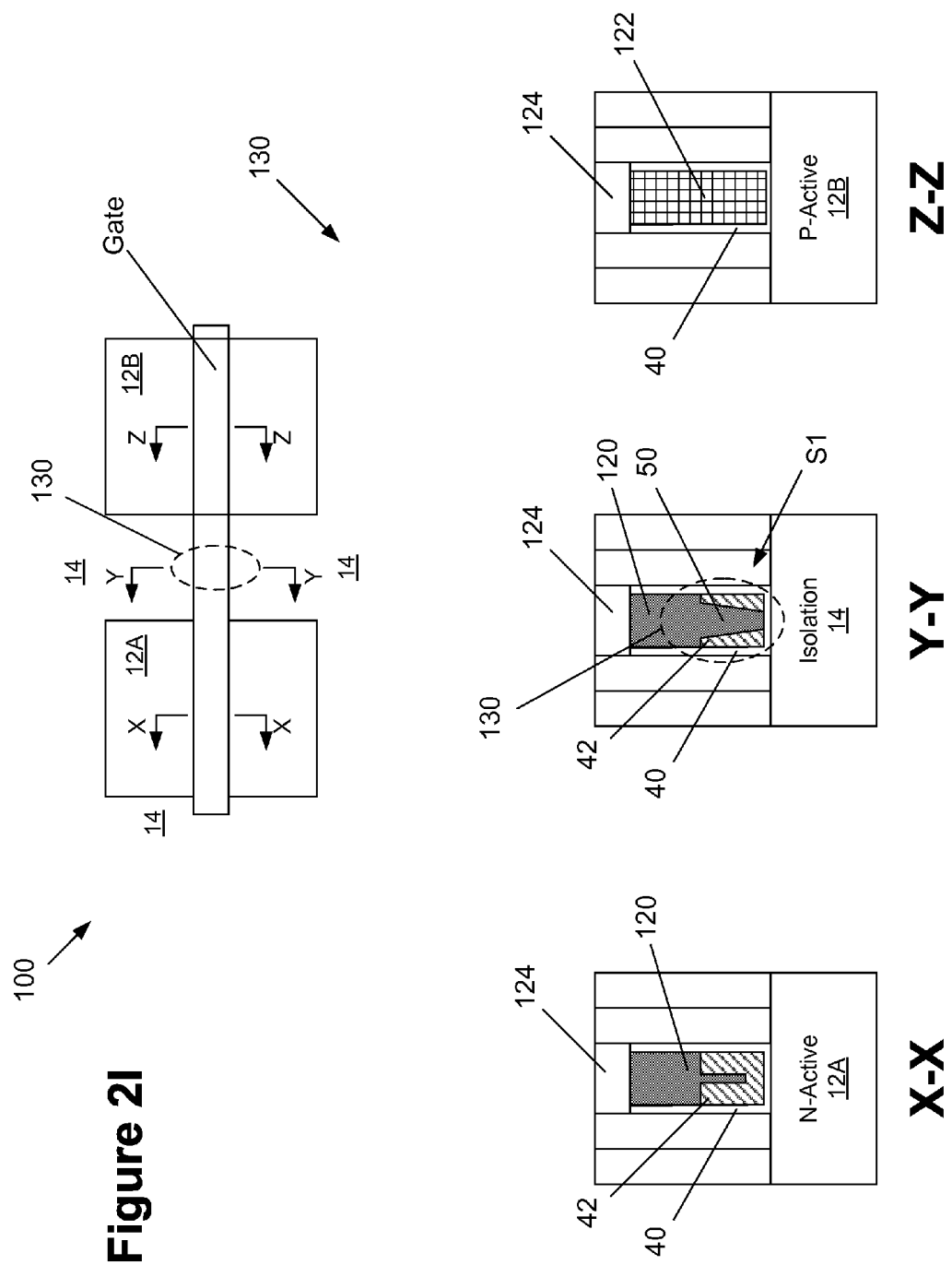

METHODS OF FORMING REPLACEMENT GATE STRUCTURES ON TRANSISTOR DEVICES WITH A SHARED GATE STRUCTURE AND THE RESULTING PRODUCTS

BACKGROUND OF THE INVENTION

1. Field of the Invention

Generally, the present disclosure relates to the manufacture of semiconductor devices, and, more specifically, to various novel methods of forming replacement gate structures on transistor devices with a shared gate structure and the resulting integrated circuit product.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer (k-value of approximately 10 or greater) and one or more metal layers that function as the gate electrode have been implemented. Such alternative gate structures—typically known as high-k/metal gate structures (HK/MG structures)—have been shown to provide significantly enhanced operational characteristics over the heretofore more traditional silicon dioxide/polysilicon gate structure configurations.

One well-known processing method that has been used for forming a transistor with a high-k/metal gate structure is the so-called "gate last" or "replacement gate" technique. Generally, the replacement gate process involves: forming a basic transistor structure (planar, FinFet, nanowire, etc.) with a sacrificial gate structure positioned between sidewall spacers; forming the source/drain regions for the device; performing the necessary anneal process to activate implanted dopant materials; removing the sacrificial gate structure so as to define a gate cavity for the replacement gate structure between the spacers; depositing a high-k gate insulation layer and a plurality of metal layers in the gate cavity; performing a CMP process to remove excess materials positioned outside of the gate cavity; recessing the gate materials within the gate cavity to make room for a gate cap layer; and forming a gate cap layer in the gate cavity above the recessed gate materials.

FIG. 1A is a simplistic and enlarged depiction of an illustrative replacement gate structure 30 that is formed above a semiconductor substrate 12. Also depicted are sidewall spacers 16, a layer of insulating material 18 and a gate cap layer 31. As depicted, the replacement gate structure 30 is comprised of a high-k gate insulation layer 30A, a work-function adjusting metal layer 30B and other layers of metal 30C, 30D and 30E. The final stacks of materials in replacement gate structures are different for NFET devices and PFET devices, although they may share some of the same materials.

However, as the gate length of transistor devices has decreased, the physical size of the gate cavity has also decreased. Thus, it is becoming physically difficult to fit all of the layers of material needed for an HK/MG replacement gate structure within such reduced-size gate cavities, particularly for NMOS devices, due to the greater number of layers of material that are typically used to form the HK/MG structures for the NMOS devices as compared to PMOS devices. For example, as gate lengths continue to decrease, voids or seams may be formed as the various layers of material are deposited into the gate cavity. That is, as the layers of material are formed in the gate cavity, the remaining space within the gate cavity becomes very small. As the later metal layers are formed, the remaining space within the gate cavity may be only about 1-2 nm in width or even smaller. In some cases, there may be essentially no remaining space in the gate cavity. This may lead to so-called "pinch-off" of metal layers such that voids or seams may be formed in the overall replacement gate structure, which may result in devices that perform at levels less than anticipated or, in some cases, the formation of devices that are simply not acceptable and have to be discarded.

FIG. 1B depicts an illustrative situation where an N-type device 10N will be formed on an N-Active region 12A adjacent to a P-type device 10P that is formed on a P-Active region 12B. As depicted, the two devices 10N, 10P share a common gate structure. Such an arrangement is typically found in, for example, an SRAM product, a ring oscillator product, etc. The N-type device 10N is separated from the P-type device 10P by an illustrative shallow trench isolation region 14 that is formed in the substrate 12. In the depicted example, the common gate structure for both devices will be formed using a so-called "replacement gate" or "gate last" technique.

When forming replacement gate structures in CMOS applications (where both N- and P-type devices are formed on the same substrate), it is common to deposit the work function metal layer for one of the devices, e.g., the N-type device (NWF metal), into the gate cavities for both the N-type device 10N and the P-type device 10P at the same time, and later selectively remove the undesirable NWF metal layer from the P-type device 10P by masking the N-type device 10N and etching the NWF metal layer in the gate cavity for the P-type device 10P. The selective removal is accomplished by forming a patterned masking layer that exposes, in this example, the P-type device 10P, and thereafter performing an etching process to remove the exposed NWF metal layer from the P-type device 10P. Of course, the reverse could happen as well, i.e., the work function metal layer for the P-type device 10P (PWF metal) could be deposited in the gate cavities for both the N- and P-type devices 10N, 10P, and later selectively removed from the N-type device 10N. The selective removal of the undesired portions of the work function metal layer (N or P) from one of the devices occurs before the formation of additional layers of material within the replacement gate cavities.

As indicated above, it is becoming physically difficult to fit all of the layers of material needed for an HK/MG replacement gate structure within the reduced-size gate cavities found on advanced integrated circuit products. FIG. 1C depicts an example, wherein a replacement gate structure will be formed in a gate cavity 44. As depicted, a high-k gate insulation layer 40 was initially formed in the gate cavity 44. Thereafter, an illustrative work function metal layer 42 (N or P depending upon the device) was deposited into the gate cavity 44 above the high-k gate insulation layer 40. Additionally, FIG. 1C depicts the device after a recess etching process was performed on the work function metal layer 42 to remove some of the work function metal layer 42 from within the gate cavity 44. FIG. 1C depicts the situation where a void or opening 50 was created in the replacement gate structure as a result of the work function metal layer 42 "pinching-off" the gate cavity 44. FIG. 1D depicts a situation where, although the work function metal layer 42 did not "pinch-off" the gate cavity 44 when it was formed, the remaining space between portions of the work function metal layer 42 is so small that the masking layer 46, e.g., OPL, cannot fill the space between the portions of the work function metal layer 42, and thereby effectively creating a void 50 in the replacement gate structure at this point in the process flow.

In the case of forming replacement gate structures where opposite polarity devices share a common gate structure, the presence of such voids 50, whether created by the work function metal layer 42 pinching-off the gate cavity 44 (FIG. 1C) or due to the fact that the space between the portions of work function metal layer 42 cannot be filled by the masking layer 46 (FIG. 1D) is problematic. As noted above, to selectively remove unwanted work function metal from one of the devices, a masking layer, such as the masking layer 46, is formed to cover one of the devices and expose the other device so that the undesired work function metal may be removed from the exposed device. The removal of the work function metal layer is typically accomplished by performing a wet etching process. Thus, if voids or openings 50 are present in the portion of the replacement gate structure positioned above the isolation region 14 at the time the wet etching process is performed, the etchants can flow through the openings or voids 50 and attack the work function metal in the masked device. Such a situation can result in partial or substantially complete removal of the desired work function metal from the masked device which, in turn, can lead to substandard device performance and/or complete failure of the circuit that includes such a device.

The present disclosure is directed to novel methods of forming replacement gate structures on transistor devices with a shared gate structure and the resulting integrated circuit product that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming replacement gate structures on transistor devices with a shared gate structure and the resulting integrated circuit product. One illustrative method disclosed herein includes, among other things, performing at least one etching process to remove a sacrificial gate structure for first and second transistor devices to thereby define a shared gate cavity that spans across an isolation region and is positioned above first and second active regions, forming at least one layer of material in the shared gate cavity above the first and second active regions and above the isolation region, forming a first masking layer that covers portions of the shared gate cavity positioned above the first and second active regions while exposing a portion of the shared gate cavity positioned above the isolation region, with the first masking layer in position, performing at least one first etching process to remove at least a portion of the at least one layer of material in the exposed portion of the shared gate cavity above the isolation region, and removing the first masking layer.

Yet another illustrative method disclosed herein includes, among other things, performing at least one etching process to remove a sacrificial gate structure for first and second transistor devices to thereby define a shared gate cavity that spans across an isolation region and is positioned above first and second active regions, forming at least one work function adjusting layer of material for the first device in the shared gate cavity above the first and second active regions and above the isolation region, forming a first masking layer that covers portions of the shared gate cavity positioned above the first and second active regions while exposing a portion of the shared gate cavity positioned above the isolation region, with the first masking layer in position, performing at least one first etching process to remove at least a portion of the at least one work function adjusting layer of material in the exposed portion of the shared gate cavity above the isolation region, and removing the first masking layer. In this example, the method further includes forming a second masking layer that covers the first active region and the previously exposed portion of the shared gate cavity positioned above the isolation region while exposing a portion of the shared gate cavity positioned above the second active region, with the second masking layer in position, performing at least one second wet etching process to remove substantially all of the at least one work function adjusting layer of material in the exposed portion of the shared gate cavity above the second active region, removing the second masking layer, forming a first final gate structure for the first device within the portion of the shared gate cavity positioned above the first active region, the first final gate structure comprising the at least one work function adjusting layer of material, and forming a second final gate structure for the second device within the portion of the shared gate cavity positioned above the second active region, the second final gate structure being substantially free of the at least one work function adjusting material.

One example of a novel integrated circuit product disclosed herein includes, among other things, a first active region where a first transistor device will be formed, a second active region where a second transistor device will be formed, the second transistor device being a type opposite the first transistor device, an isolation region positioned between the first and second active regions, a shared gate structure that spans across the isolation region and is positioned above the first and second active regions and a work function adjusting metal for the first device that extends continuously across the first active region and above a part of the isolation region, wherein the work function adjusting metal has a discontinuity region positioned above a portion of the isolation region, and wherein a quantity of work function adjusting metal in a cross-section taken of the discontinuity region in a gate length direction of the first device is less than a quantity of the work function adjusting metal in a cross-section taken of the first active region in the gate length direction of the first device.

Yet another illustrative device disclosed herein includes a first active region where a first transistor device will be formed, a second active region where a second transistor device will be formed, the second transistor device being a type opposite the first transistor device, an isolation region positioned between the first and second active regions, a shared gate structure that spans across the isolation region and is positioned above the first and second active regions, a first portion of a work function adjusting metal for the first device that extends continuously across the first active region and above a first part of the isolation region, a second portion of the work function adjusting metal for the first device that extends continuously across a second part of the isolation region and a discontinuity region positioned above the isolation region between the first and second portions of the work function adjusting metal, wherein the discontinuity region is substantially free of the work function adjusting metal.

BRIEF DESCRIPTION OF THE DRAWINGS

The disclosure may be understood by reference to the following description taken in conjunction with the accompanying drawings, in which like reference numerals identify like elements, and in which:

FIGS. 2A-2I depict various illustrative novel methods disclosed herein for forming replacement gate structures on transistor devices with a shared gate structure and the resulting integrated circuit product.

Figure 1A:
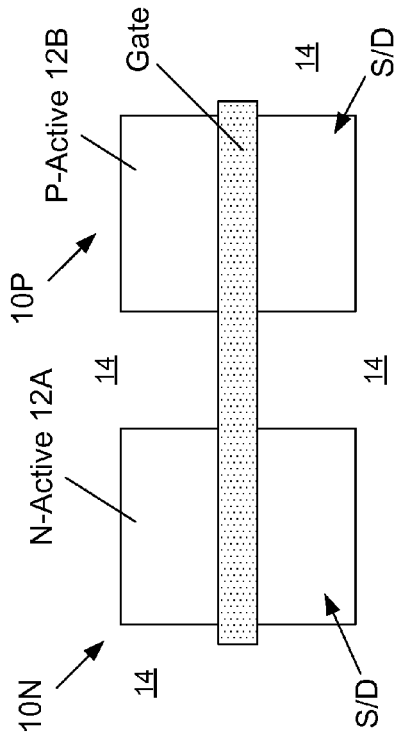
FIGS. 1A-1D depict various illustrative aspects relating to the formation of a replacement gate structure on prior art transistor devices with a shared gate structure and the resulting integrated circuit product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming replacement gate structures on transistor devices with a shared gate structure and the resulting integrated circuit product. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, the methods and structures disclosed herein may be used when forming any type of transistor device, e.g., planar devices, 3D transistor devices, nanowire devices, etc., or a combination of such devices. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
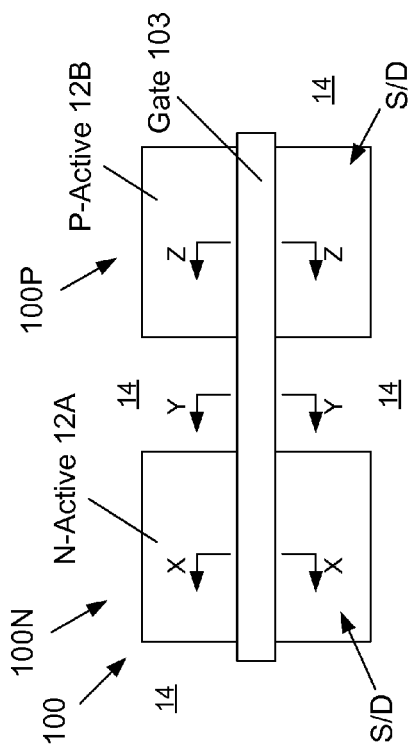
Figure 2A:
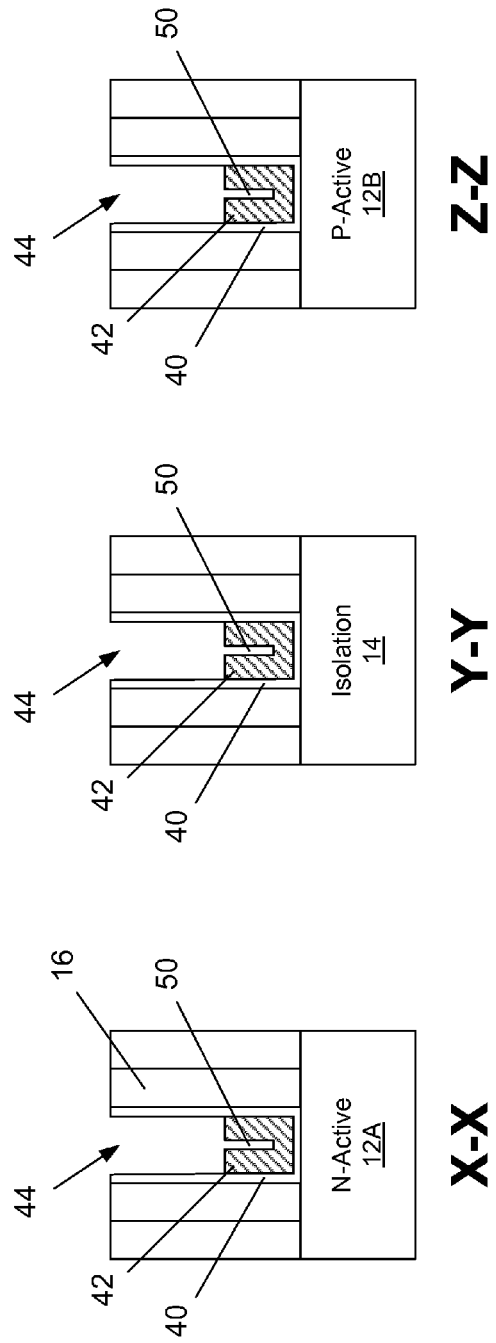

The following figures will use some reference numbers that have been previously described in the background section of this application. FIG. 2A is a simplified, cross-sectional view of an illustrative integrated circuit product 100, where an N-type device 100N will be formed on an N-Active region 12A adjacent to a P-type device 100P that is formed on a P-Active region 12B. As depicted, the two devices 100N, 100P share a common gate structure 103. The N-type device 100N is separated from the P-type device 100P by an illustrative shallow trench isolation region 14 that is formed in the substrate 12. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. The substrate 12 may be made of silicon or it may be made of materials other than silicon. Thus, the terms "substrate" or "semiconductor substrate" should be understood to cover all semiconducting materials and all forms of such materials.

Figure 1C:
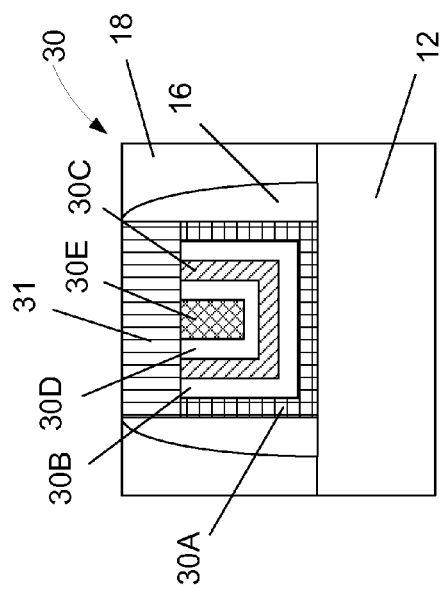
Figure 1B:
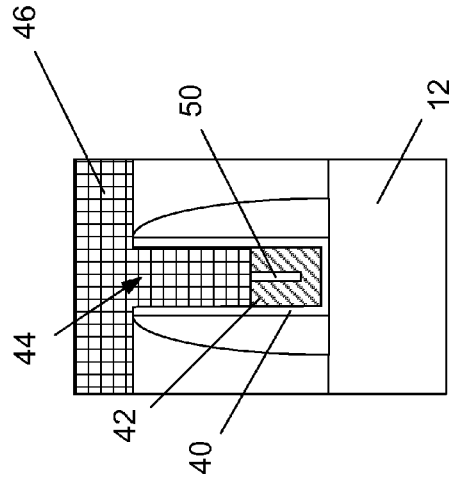
Figure 1D:
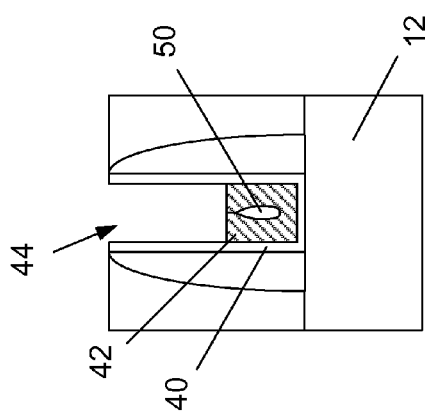

In the depicted example, the common gate structure 103 for both devices will be formed using a so-called "replacement gate" or "gate last" technique. The following drawings contain a plan view and three cross-sectional views taken where indicated in the plan view. FIG. 2A depicts the product 100 at a point in the process flow where a replacement gate structure will be formed in the replacement gate cavity 44 for the shared gate structure 103. More specifically, FIG. 2A depicts the product 100 after a high-k gate insulation layer 40 was initially formed in the gate cavity 44, after an illustrative N work function metal layer 42 (NWF metal layer 42) was deposited into the gate cavity 44 above the high-k gate insulation layer 40, and after a recess etching process was performed on the NWF metal layer 42 to remove some of the NWF metal layer 42 from within the gate cavity 44 for both devices 100N, 100P. For purposes of disclosing the present subject matter, the following drawings and descriptions will depict the example wherein the NWF metal layer 42 is removed from the P-type device 100P. Of course, as noted in the background section of this application, the situation could be reversed wherein a P work function metal layer that was initially deposited in the gate cavity for both the N and P devices may be selectively removed from the gate cavity above the N-type device. Moreover, for purposes of disclosure, the drawings will depict the illustrative example shown in FIG. 1D, wherein the voids or opening 50 is simply too small to be filled by the masking layer 46. Of course, the inventions disclosed herein apply equally to the situation where voids or openings 50 are present in the replacement gate structure due to the gate cavity 44 being pinched-off by one or more layers of material, as depicted in FIG. 1C. It should also be noted that, although the NWF layer metal 42 is depicted as being recessed, such recessing of the materials within the gate cavity 44 is not required to practice the presently disclosed inventions.

Figure 2B:
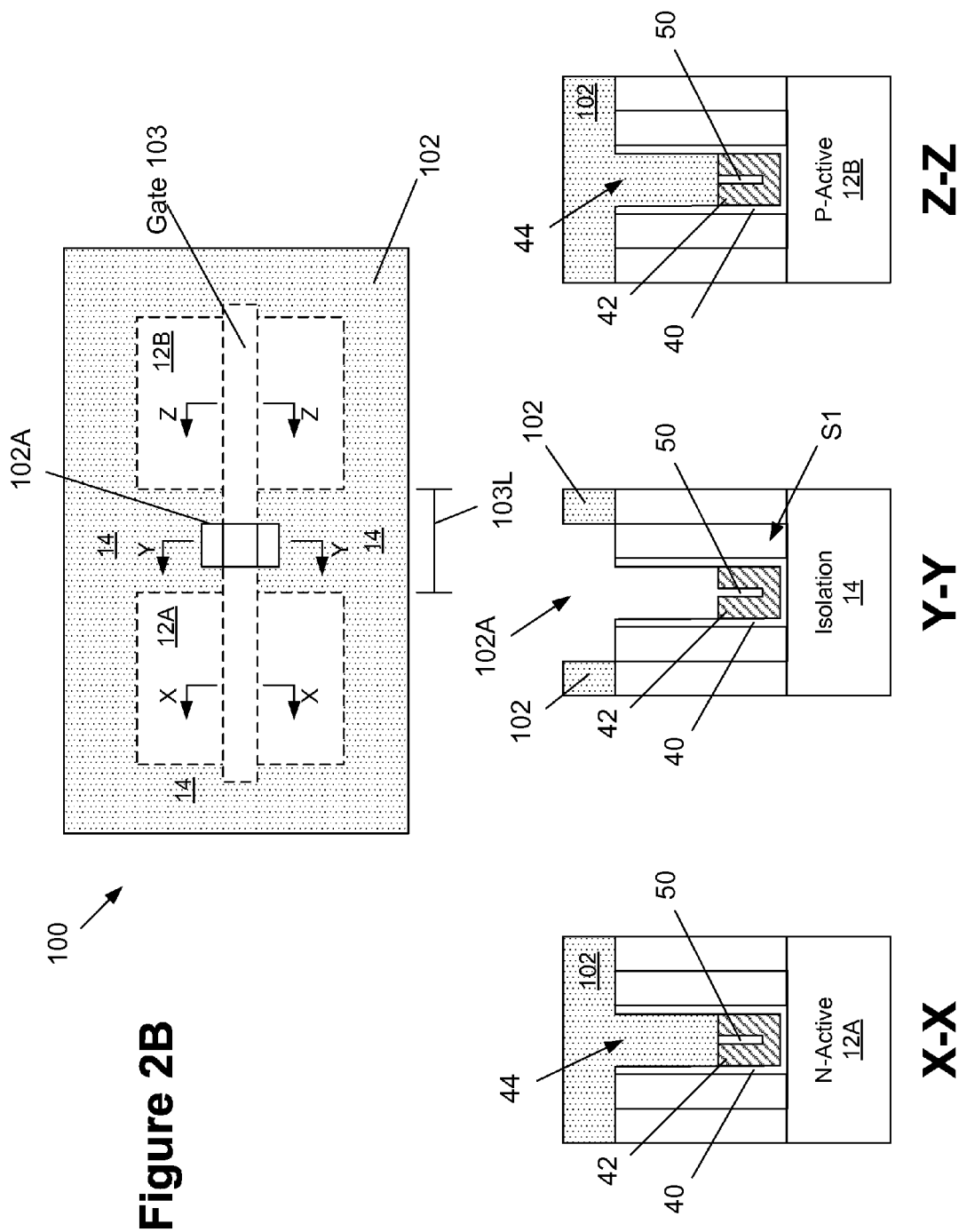

FIG. 2B depicts the product 100 after a patterned masking layer 102, e.g., OPL, photoresist, etc., was formed on the product. As depicted, the patterned masking layer 102 masks both the N-type device 100N (view X-X) and the P-type device 100P (view Z-Z), but has an opening 102A above the isolation region 14 that exposes a portion of the gate structure 103 (view Y-Y). The size of the opening 102A may vary depending upon the particular application. However, the opening 102A will only expose a portion of the length 103L of the gate structure 103 that spans across the isolation region 14. That is, the opening 102A will not be so large (in the gate width direction of the devices 100N, 100P) so as to be positioned above either active region 12A or 12B. In practice, the opening 102A may be centered at approximately the midpoint of the axial length 103L of the gate structure 103. In one illustrative embodiment, the dimension of the opening 102A in the gate width direction of the devices 100N, 100P may be about one-third to one-quarter of the axial length 103L of the portion of the gate structure 103 that is positioned above the isolation region 14. The patterned masking layer 102 may be formed using traditional tools and techniques.

Figure 2C:
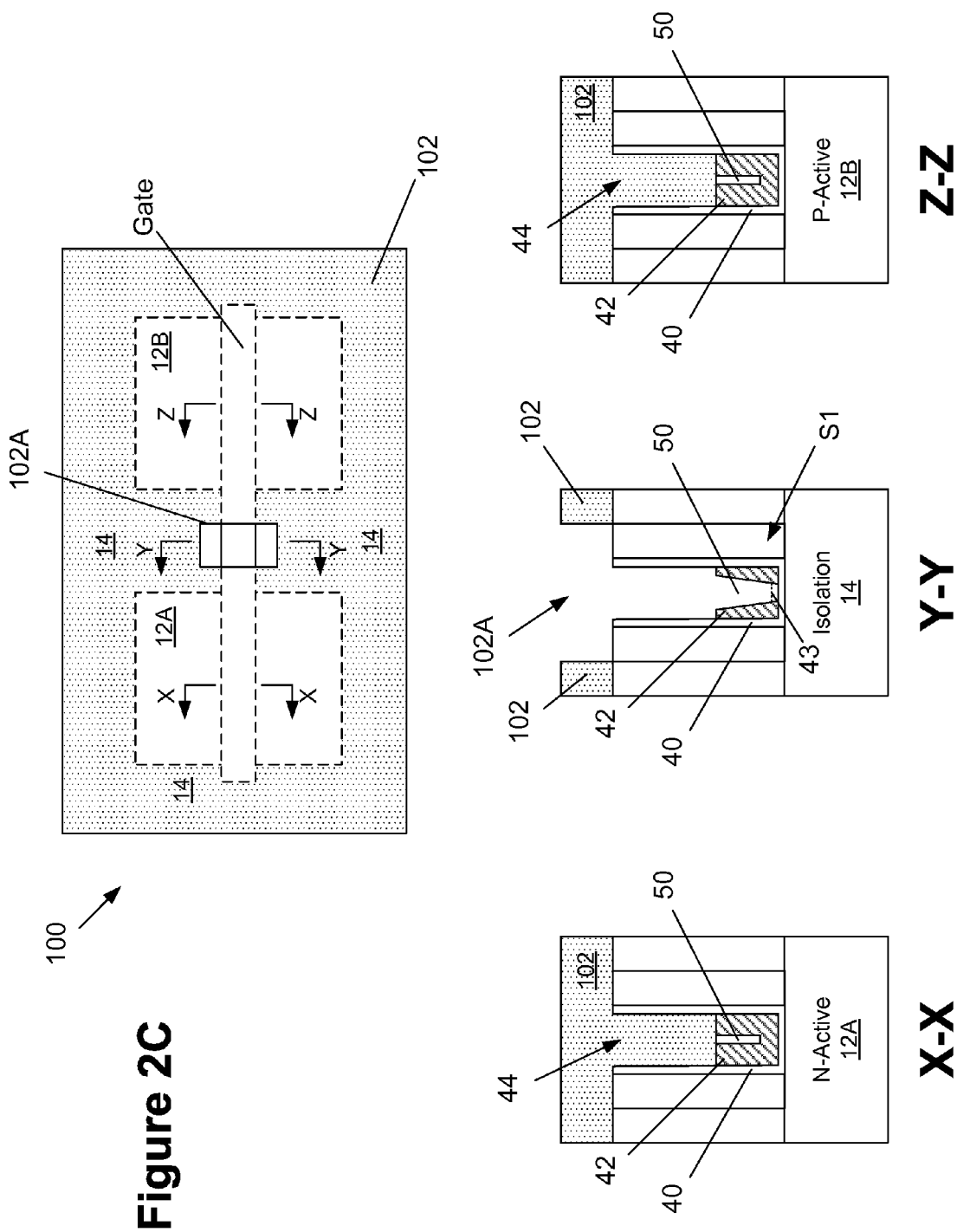

FIG. 2C depicts the product 100 after one or more dry etching processes were performed through the opening 102A in the patterned masking layer 102 to remove some or all of the NWF metal layer 42, and perhaps other materials, in the exposed portion of the gate cavity 44 above the isolation region 14. In general, the etching process is performed to make the opening or void 50 bigger, or to eliminate it completely, so that a subsequent masking layer can reliably fill the portion of the gate cavity 44 below the opening 102A. As a result, the later-formed masking layer can reliably fill the portion of the gate cavity 44 below the opening 102A and block the flow of wet etchant materials when the NWF metal layer 42 is subsequently selectively removed from the P-type device 100P.

With continued reference to FIG. 2C, the materials removed, as well as the amount of materials removed, from the exposed portion of the gate cavity 44 during the above-described etching process may vary depending upon the particular application. By way of example only, and not by way of limitation, the inventors have identified seven illustrative examples of structures (labeled S1-S7) that may be formed by performing one or more etching processes through the opening 102A on the materials in the gate cavity 44. FIG. 2C depicts structure S1, wherein a selective etching process was performed to remove portions of the NWF metal layer 42 so as to effectively widen the opening or void 50. In one embodiment, the etching process depicted in FIG. 2C was performed such that it stopped on the high-k gate insulation layer 40. In other embodiments, the etching process may be a timed etching process that stops short of exposing the high-k gate insulation layer 40, i.e., the residual, etched portions of the NWF metal layer 42 may still cover the entire bottom of the gate cavity 44, as depicted by dashed line 43 in FIG. 2C.

Figure 2D:
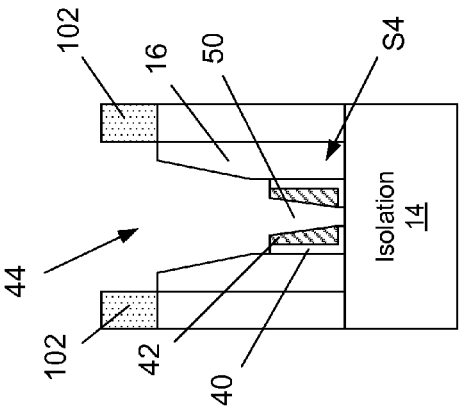
Figure 2D:
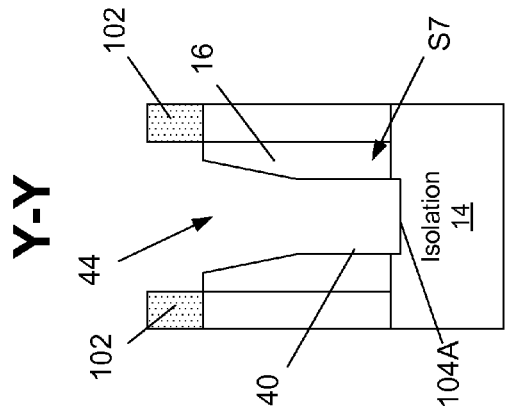
Figure 2D:
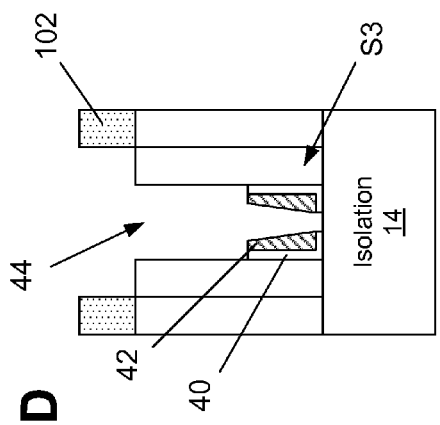
Figure 2D:
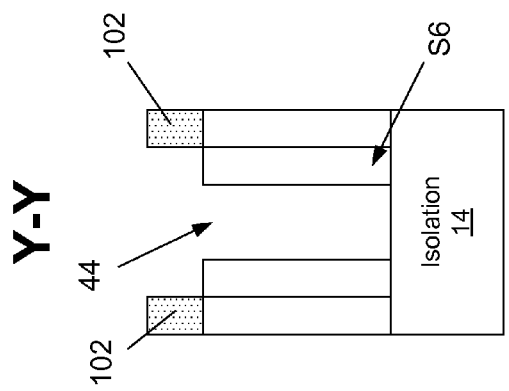
Figure 2D:
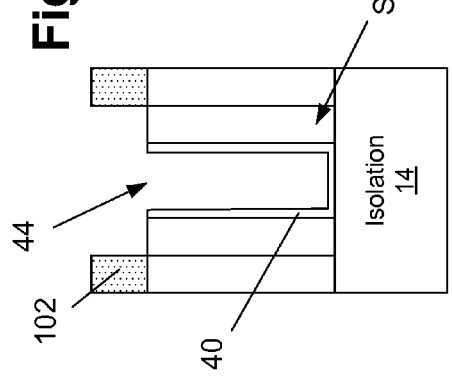
Figure 2D:
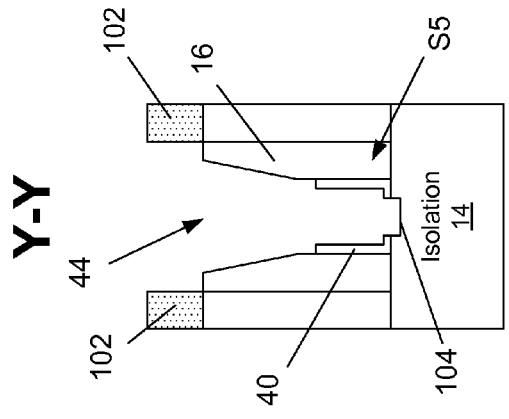

FIG. 2D depicts six other possible structures (S2-S7) that may result from etching the materials in the exposed portion of the gate cavity 44 of the shared gate structure 103. With respect to structure S2, an etching process was performed through the opening 102A until such time as substantially all of the NWF metal layer 42 in the gate cavity 44 below the opening 102A was removed selectively relative to the high-k gate insulation layer 40.

With respect to structure S3, a first etching process was performed through the opening 102A to remove a portion of the NWF metal layer 42 in the gate cavity 44 below the opening 102A selectively relative to the high-k gate insulation layer 40. Thereafter, a second etching process was performed to remove exposed portions of the high-k gate insulation layer 40 that are not protected by the residual, etched portions of the NWF metal layer 42. In this example, a portion of the isolation region 14 is exposed within the gate cavity 44.

Structure S4 is similar to structure S3, except that an additional etching process was performed to trim the upper portions of the spacers 16 to arrive at structure S4. By trimming the spacers 16, the opening of the gate cavity 44 under the opening 102A is made effectively wider, thereby making the filling of the gate cavity 44 easier.

In structure S5, a first etching process was performed through the opening 102A to remove a portion of the NWF metal layer 42 in the gate cavity 44 below the opening 102A selectively relative to the high-k gate insulation layer 40. Thereafter, a second etching process was performed to remove exposed portions of the high-k gate insulation layer 40 that are not protected by the residual, etched NWF metal layer 42 so as to expose a portion of the isolation region 14. Then, another etching process was performed to remove the residual, etched portions of the NWF metal layer 42. The above-described spacer-trim etching process was also performed at some point in the process flow to trim the upper portions of the spacers 16. Additionally, in this example, a small trench 104 was formed in the exposed portion of the isolation region 14 within the gate cavity 44 under the opening 102A in the patterned masking layer 102.

With respect to structure S6, one or more etching processes were performed through the opening 102A until such time as substantially all of the NWF metal layer 42 and substantially all of the high-k gate insulation layer 40 in the gate cavity 44 below the opening 102A were removed. In this example, the isolation region 14 is exposed within the gate cavity 44.

Structure S7 is similar to structure S6 except that a trench 104A was etched into the isolation region 14, and the above-described spacer-trim etching process was also performed at some point in the process flow to trim the upper portions of the spacers 16. For purposes of disclosure, the remaining drawings will depict the structure S1 as being formed in the gate cavity 44 under the opening 102A. Of course, those skilled in the art will appreciate that the use of the structure S1 is only an example and that, as an example, the presently disclosed inventions should not be considered to be limited to only those cases where the structure S1 is formed.

FIG. 2E depicts the product after the patterned masking layer 102 was removed.

FIG. 2F depicts the product 100 after another patterned masking layer 110, e.g., OPL, photoresist, etc., was formed on the product. As depicted, the patterned masking layer 110 masks the N-type device 100N (view X-X) and the portion of the gate cavity 44 that was previously exposed under the opening 102A in the patterned masking layer 102 (view Y-Y). The patterned masking layer 110 has an opening 110A that exposes the P-type device 100P so that the exposed portions of the NWF metal layer 42 may be removed selectively from the P-type device 100P. The patterned masking layer 110 may be formed using traditional tools and techniques. Note that, due to the etching of the material(s) in the gate cavity 44 above the isolation region 14, as described above, the masking layer 110 can reliably fill the gate cavity 44 at the location where the material(s) were removed from the gate cavity 44, as indicated within the dashed-line regions 112.

FIG. 2G depicts the product 100 after one or more wet etching processes were performed through the opening 110A in the patterned masking layer 110 to remove substantially all of the NWF metal layer 42 within the gate cavity 44 above the P-Active region 12B (view Z-Z). During this process, the masking layer within the dashed line region 112 effectively blocks the flow of any wet etchant material toward the N-type device 100N. Accordingly, using the methods disclosed herein, the NWF metal layer 42 in the N-type device 100N may be reliably protected when the NWF metal layer 42 is selectively removed from the gate cavity of the P-type device 100P.

FIG. 2H depicts the product after the patterned masking layer 110 was removed. At this point in the process flow, traditional replacement gate manufacturing techniques may be performed to complete the formation of replacement gate structures for the devices 100N, 100P.

Accordingly, FIG. 2I depicts the product 100 after illustrative and schematically depicted final gate structures 120, 122 were formed for the N-type device 100N and P-type device 100P, respectively, using well-known replacement-gate manufacturing techniques, such as those briefly outlined in the background section of this application. Also depicted is an illustrative gate cap layer 124. As will be recognized by those skilled in the art after a complete reading of the present application, the final gate structures 120, 122 of the devices 100N, 100P are intended to be representative in nature. Of course, the materials of construction of the final gate structures 120, 122 for the devices 100N, 100P may be different. The gate cap layer 124 may be comprised of a material such as silicon nitride.

As will be appreciated by those skilled in the art after a complete reading of the present application, a novel integrated circuit product 100 may be produced using the method disclosed herein. With reference to FIGS. 2C, 2D and 2I, by performing an etching process through the relatively small opening 102A in the patterned masking layer 102 to remove some or all of the NWF metal layer 42, and perhaps other materials, in the exposed portion of the gate cavity 44 above the isolation region 14, a discontinuity region 130 is created in the NWF metal layer 42 in the area substantially defined by the opening 102A. This discontinuity region 130 may exhibit only partial removal of the NWF metal layer 42 (structures S1 (including the dashed line 43 example), S3 and S4) or substantially complete removal of the NWF metal layer 42 (structures S2 and S5-S7). In the case where only a portion of the NWF metal layer 42 is removed by etching, the resulting NWF metal layer 42 in the final device 100 will extend continuously across the first active region 12A and above a part of the isolation region 14 past the discontinuity region 130 by a small distance toward the P-Active region 12B. However, due to the previous etching of the NWF metal layer 42, a quantity of NWF metal layer 42 in a cross-section taken of the discontinuity region 130 in a gate length direction of the N-type device 100N is less than a quantity of the NWF metal layer 42 in a cross-section taken of the first active region 12A in the gate length direction of the first device. In the case where substantially all of the NWF metal layer 42 is removed by etching through the opening 102A, a first portion of the NWF metal layer 42 will extend continuously across the first active region 12A and above a first part of the isolation region 14, and a second relatively small (length-wise) portion of the NWF metal layer 42 will extend continuously across a second part of the isolation region 14 (above a portion of the isolation region 14 between the opening 102A and the P-active region 12B). In this case, the discontinuity region 130 is positioned above the isolation region 14 between the first and second portions of the NWF metal layer 42, wherein the discontinuity region 130 is substantially free of the NWF metal layer 42.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming replacement gate structures for first and second transistor devices that are formed in and above adjacent first and second active regions, respectively, that are separated by an isolation region, said first and second transistor devices comprising a shared gate structure, wherein the method comprises:
performing at least one etching process to remove a sacrificial gate structure for said first and second transistor devices to thereby define a shared gate cavity that spans across said isolation region and is positioned above said first and second active regions;
forming at least one layer of material in said shared gate cavity above said first and second active regions and above said isolation region;

forming a first masking layer that covers portions of said shared gate cavity positioned above said first and second active regions while exposing a portion of said shared gate cavity positioned above said isolation region;

with said first masking layer in position, performing at least one first etching process to remove at least a portion of said at least one layer of material in the exposed portion of said shared gate cavity above said isolation region; and removing said first masking layer.

2. The method of claim 1, wherein said at least one layer of material comprises at least one work function adjusting layer of material for said first transistor device.

3. The method of claim 1, wherein said first transistor device is an N-type device, said second transistor device is a P-type device and said at least one layer of material comprises a work function adjusting material layer for said N-type device.

4. The method of claim 1, wherein said first transistor device is a P-type device, said second transistor device is an N-type device and said at least one layer of material comprises a work function adjusting material layer for said P-type device.

5. The method of claim 1, wherein performing said at least one first etching process comprises performing said at least one first etching process so as to remove substantially all of said at least one layer of material in the exposed portion of said shared gate cavity above said isolation region.

6. The method of claim 1, wherein performing said at least one first etching process comprises performing said at least one first etching process so as to remove at least a portion of another material layer, other than said at least one layer of material, positioned in the exposed portion of said shared gate cavity above said isolation region.

7. The method of claim 1, wherein performing said at least one first etching process comprises performing said at least one first etching process so as to remove substantially all of another material layer, other than said at least one layer of material, positioned in the exposed portion of said shared gate cavity above said isolation region.

8. The method of claim 7, wherein said at least one layer of material is a work function adjusting layer of material for said first transistor device and said another material layer is a layer of high-k insulation material.

9. The method of claim 1, wherein said shared gate cavity is laterally defined by sidewall spacers, and wherein performing said at least one first etching process comprises performing a spacer trim etching process so as to reduce a thickness of an upper portion of said sidewall spacers.

10. The method of claim 1, wherein performing said at least one first etching process exposes a portion of said isolation region within the exposed portion of said shared gate cavity.

11. The method of claim 1, wherein, prior to forming said first masking layer, the method further comprises performing a recess etching process to remove a portion but not all of said at least one layer of material positioned in said shared gate cavity above said first and second active regions and above said isolation region.

12. The method of claim 1, further comprising:
forming a second masking layer that covers said first active region and the previously exposed portion of said shared gate cavity positioned above said isolation region while exposing a portion of said shared gate cavity positioned above said second active region;

with said second masking layer in position, performing at least one second isotropic etching process to remove at least substantially all of said at least one layer of material in the exposed portion of said shared gate cavity above said second active region;

removing said second masking layer;

forming a first final gate structure for said first transistor device within the portion of said shared gate cavity positioned above said first active region, said first final gate structure comprising said at least one layer of material; and forming a second final gate structure for said second transistor device within the portion of said shared gate cavity positioned above said second active region, said second final gate structure being substantially free of said at least one layer of material.

13. A method of forming replacement gate structures for first and second transistor devices that are formed in and above adjacent first and second active regions, respectively, that are separated by an isolation region, said first and second transistor devices comprising a shared gate structure, wherein the method comprises:

performing at least one etching process to remove a sacrificial gate structure for said first and second transistor devices to thereby define a shared gate cavity that spans across said isolation region and is positioned above said first and second active regions;

forming at least one work function adjusting layer of material for said first transistor device in said shared gate cavity above said first and second active regions and above said isolation region;

forming a first masking layer that covers portions of said shared gate cavity positioned above said first and second active regions while exposing a portion of said shared gate cavity positioned above said isolation region;

with said first masking layer in position, performing at least one first etching process to remove at least a portion of said at least one work function adjusting layer of material in the exposed portion of said shared gate cavity above said isolation region;

removing said first masking layer;

forming a second masking layer that covers said first active region and the previously exposed portion of said shared gate cavity positioned above said isolation region while exposing a portion of said shared gate cavity positioned above said second active region;

with said second masking layer in position, performing at least one second isotropic etching process to remove substantially all of said at least one work function adjusting layer of material in the exposed portion of said shared gate cavity above said second active region;

removing said second masking layer;

forming a first final gate structure for said first transistor device within the portion of said shared gate cavity positioned above said first active region, said first final gate structure comprising said at least one work function adjusting layer of material; and forming a second final gate structure for said second transistor device within the portion of said shared gate cavity positioned above said second active region, said second final gate structure being substantially free of said at least one work function adjusting material.

14. The method of claim 13, wherein said first transistor device is an N-type device, said second transistor device is a P-type device and said work function adjusting layer of material is a work function adjusting material layer for said N-type device.

15. The method of claim 13, wherein said first transistor device is a P-type device, said second transistor device is an N-type device and said work function adjusting layer of material is a work function adjusting material layer for said P-type device.

16. The method of claim 13, wherein performing said at least one first etching process comprises performing said at least one first etching process so as to remove substantially all of said at least one work function adjusting layer of material in the exposed portion of said shared gate cavity above said isolation region.

17. The method of claim 13, wherein performing said at least one first etching process comprises performing said at least one first etching process so as to remove at least a portion of another material layer, other than said at least one work function adjusting layer of material, positioned in the exposed portion of said shared gate cavity above said isolation region.

18. The method of claim 13, wherein performing said at least one first etching process comprises performing said at least one first etching process so as to remove substantially all of another material layer, other than said at least one work function adjusting layer of material, positioned in the exposed portion of said shared gate cavity above said isolation region.

19. The method of claim 13, wherein said shared gate cavity is laterally defined by sidewall spacers, and wherein performing said at least one first etching process comprises performing a spacer trim etching process so as to reduce a thickness of an upper portion of said sidewall spacers.

20. The method of claim 13, wherein performing said at least one first etching process exposes a portion of said isolation region within the exposed portion of said shared gate cavity.

* * * * *